(12) United States Patent
Hsiao et al.

(10) Patent No.: US 9,906,244 B2
(45) Date of Patent: Feb. 27, 2018

(54) DECODING METHOD, MEMORY STORAGE DEVICE AND MEMORY CONTROL CIRCUIT UNIT

(71) Applicant: EpoStar Electronics (BVI) Corporation, Tortola OT (VG)

(72) Inventors: Yu-Hua Hsiao, Hsinchu County (TW); Heng-Lin Yen, Hsinchu County (TW)

(73) Assignee: EpoStar Electronics (BVI) Corporation, Tortola (VG)

( * ) Notice: Subject to any disclaimer, the term of this patent is extended or adjusted under 35 U.S.C. 154(b) by 0 days.

(21) Appl. No.: 15/068,663

(22) Filed: Mar. 14, 2016

(65) Prior Publication Data

US 2017/0206130 A1 Jul. 20, 2017

(30) Foreign Application Priority Data

Jan. 20, 2016 (TW) .............................. 105101654 A

(51) Int. Cl.
*H03M 13/37* (2006.01)
*G06F 11/10* (2006.01)
(Continued)

(52) U.S. Cl.
CPC ..... *H03M 13/3715* (2013.01); *G06F 11/1068* (2013.01); *G11C 16/10* (2013.01); *G11C 16/26* (2013.01); *G11C 29/021* (2013.01); *G11C 29/028* (2013.01); *H03M 13/1111* (2013.01); *H03M 13/6325* (2013.01);
(Continued)

(58) Field of Classification Search
CPC ..... G06F 11/1068; G11C 16/26; G11C 16/10; G11C 29/52; H03M 13/3715
See application file for complete search history.

(56) References Cited

U.S. PATENT DOCUMENTS

2011/0161775 A1* 6/2011 Weingarten ......... G06F 11/1048
714/755
2013/0173985 A1* 7/2013 Chung ............... H03M 13/1111
714/755

(Continued)

OTHER PUBLICATIONS

Y. Cai, E. F. Haratsch, O. Mutlu, K. Mai, "Threshold voltage distribution in MLC NAND flash memory: Characterization analysis and modeling", Proc. DATE, pp. 1285-1290, 2013.*

(Continued)

*Primary Examiner* — Cynthia Britt
(74) *Attorney, Agent, or Firm* — JCIPRNET

(57) ABSTRACT

A decoding method, a memory storage device and a memory control circuit unit are provided. The method includes: programming first data into a first physical unit of a rewritable non-volatile memory module; reading the first physical unit to obtain second data; obtaining a first threshold voltage distribution of a first bit-value and a second threshold voltage distribution of a second bit-value according to the first data and the second data, wherein the first bit-value and the second bit-value are different; calculating first channel reliability information corresponding to the first physical unit according to the first threshold voltage distribution and the second threshold voltage distribution; and decoding third data stored in the first physical unit according to the first channel reliability information. Therefore, decoding efficiency for the first physical unit is improved.

21 Claims, 11 Drawing Sheets

(51) Int. Cl.
*G11C 16/10* (2006.01)
*G11C 16/26* (2006.01)
*G11C 29/02* (2006.01)
*H03M 13/11* (2006.01)
*H03M 13/00* (2006.01)
*H03M 13/15* (2006.01)
*H03M 13/23* (2006.01)
*H03M 13/29* (2006.01)

(52) U.S. Cl.
CPC .......... *H03M 13/152* (2013.01); *H03M 13/23* (2013.01); *H03M 13/2957* (2013.01)

(56) References Cited

U.S. PATENT DOCUMENTS

| | | | | |
|---|---|---|---|---|
| 2013/0185598 | A1* | 7/2013 | Haratsch | G06F 11/1048 714/42 |
| 2013/0215678 | A1* | 8/2013 | Yang | G06F 11/1048 365/185.03 |
| 2014/0063945 | A1* | 3/2014 | Park | G11C 11/5642 365/185.09 |
| 2014/0185377 | A1* | 7/2014 | Kim | G11C 16/26 365/185.03 |
| 2014/0355340 | A1* | 12/2014 | Sharon | G11C 16/26 365/185.03 |
| 2015/0095741 | A1 | 4/2015 | Lin et al. | |
| 2015/0149840 | A1* | 5/2015 | Alhussien | H03M 13/1125 714/719 |
| 2015/0155058 | A1 | 6/2015 | Weng | |
| 2015/0193204 | A1 | 7/2015 | Lin et al. | |
| 2015/0287453 | A1 | 10/2015 | Wu et al. | |
| 2015/0293811 | A1* | 10/2015 | Lin | G06F 11/1008 714/773 |
| 2017/0031755 | A1* | 2/2017 | Nakanishi | G06F 11/1068 |
| 2017/0111060 | A1* | 4/2017 | Huang | H03M 13/45 |

OTHER PUBLICATIONS

"Office Action of Taiwan Counterpart Application," dated Feb. 17, 2017, p. 1-p. 6.

* cited by examiner

|  | Region 1101 | Region 1102 | Region 1103 | Region 1104 | Region 1105 | Region 1106 |
|---|---|---|---|---|---|---|
| Threshold voltage distribution 1120 | 5 | 6 | 9 | 72 | 309 | 18031 |
| Threshold voltage distribution 1110 | 17497 | 230 | 208 | 189 | 124 | 184 |
| Channel reliability information | −8 | −4 | −3 | −1 | 1 | 5 |

DECODING METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 105101654, filed on Jan. 20, 2016. The entirety of the above-mentioned patent application is hereby incorporated by reference herein and made a part of this specification.

BACKGROUND

Technology Field

The present disclosure relates to a decoding technique, in particular, relates to a decoding method, a memory storage device and a memory control circuit unit.

Description of Related Art

Digital cameras, mobile phones and MP3 players are quickly developed in recent years, so that consumer demands for storage media have also rapidly increased. Since a rewritable non-volatile memory module (for example, a flash memory) has characteristics of data non-volatility, low power consumption, small volume, and non-mechanical structure, etc., it is adapted to be built in the aforementioned various portable multimedia devices.

Generally, the smallest unit for storing data in the rewritable non-volatile memory module is a memory cell. Along with increase of a usage level of the rewritable non-volatile memory module, reliability of the memory cells is decreased, which may cause errors of data stored in the memory cells. Therefore, after certain data is read from the rewritable non-volatile memory module, the error may be corrected through a decoding procedure. However, in some decoding procedures performed based on concept of probability, if some parameters used in the corresponding decoding procedures are not adaptively adjusted along with different usage levels of the memory cells, it may cause reduction of subsequent decoding efficiency.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY

Accordingly, the present disclosure is directed to a decoding method, a memory storage device and a memory control circuit unit, by which channel reliability information corresponding to memory cells with different usage levels may be updated in real-time, so as to improve decoding efficiency.

An exemplary embodiment of the present disclosure provides a decoding method, which is adapted to a rewritable non-volatile memory module, where the rewritable non-volatile memory module includes a plurality of physical units, and the decoding method includes following steps. First data is programmed into at least one first physical unit among the physical units. The first physical unit is read to obtain second data. A first threshold voltage distribution corresponding to a first bit value and a second threshold voltage distribution corresponding to a second bit value are obtained according to the first data and the second data, where the first bit value and the second bit value are different. First channel reliability information corresponding to the first physical unit is calculated according to the first threshold voltage distribution and the second threshold voltage distribution. Third data stored in the first physical unit is decoded according to the first channel reliability information.

Another exemplary embodiment of the present disclosure provides a memory storage device including a connection interface unit, a rewritable non-volatile memory module and a memory control circuit unit. The connection interface unit is coupled to a host system. The rewritable non-volatile memory module includes a plurality of physical units. The memory control circuit unit is coupled to the connection interface unit and the rewritable non-volatile memory module, and the memory control circuit unit is configured to send a writing command sequence which instructs to program first data into at least one first physical unit among the physical units. The memory control circuit unit is further configured to send a reading command sequence which instructs to read the first physical unit to obtain second data, the memory control circuit unit is further configured to obtain a first threshold voltage distribution corresponding to a first bit value and a second threshold voltage distribution corresponding to a second bit value according to the first data and the second data, where the first bit value and the second bit value are different, the memory control circuit unit is further configured to calculate first channel reliability information corresponding to the first physical unit according to the first threshold voltage distribution and the second threshold voltage distribution, and the memory control circuit unit is further configured to decode third data stored in the first physical unit according to the first channel reliability info' illation.

Another exemplary embodiment of the present disclosure provides a memory control circuit unit, which is adapted to control a rewritable non-volatile memory module. The rewritable non-volatile memory module includes a plurality of physical units. The memory control circuit unit includes a host interface, a memory interface, an error checking and correcting circuit and a memory management circuit. The host interface is coupled to a host system. The memory interface is coupled to the rewritable non-volatile memory module. The memory management circuit is coupled to the host interface, the memory interface and the error checking and correcting circuit, and the memory management circuit is configured to send a writing command sequence which instructs to program first data into at least one first physical unit among the physical units. The memory management circuit is further configured to send a reading command sequence which instructs to read the first physical unit to obtain second data, the memory management circuit is further configured to obtain a first threshold voltage distribution corresponding to a first bit value and a second threshold voltage distribution corresponding to a second bit value according to the first data and the second data, where the first bit value and the second bit value are different, and the memory management circuit is further configured to calculate first channel reliability information corresponding to the first physical unit according to the first threshold voltage distribution and the second threshold voltage distribution, and the error checking and correcting circuit is configured to decode third data stored in the first physical unit according to the first channel reliability information.

According to the above description, after storing the first data to the first physical unit and reading the first physical unit to obtain the second data, by analysing the first data and the second data, the first threshold voltage distribution corresponding to the first bit value and the second threshold voltage distribution corresponding to the second bit value are obtained. The first channel reliability information corresponding to the first physical unit is obtained according to the first threshold voltage distribution and the second threshold voltage distribution. Then, the data stored in the first physical unit can be decoded according to the first channel reliability information, so as to improve the decoding efficiency.

It should be understood, however, that this Summary may not contain all of the aspects and embodiments of the present disclosure, is not meant to be limiting or restrictive in any manner, and that the disclosure as disclosed herein is and will be understood by those of ordinary skill in the art to encompass obvious improvements and modifications thereto.

In order to make the aforementioned and other features and advantages of the present disclosure comprehensible, several exemplary embodiments accompanied with figures are described in detail below.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

DESCRIPTION OF EMBODIMENTS

Figure 1:
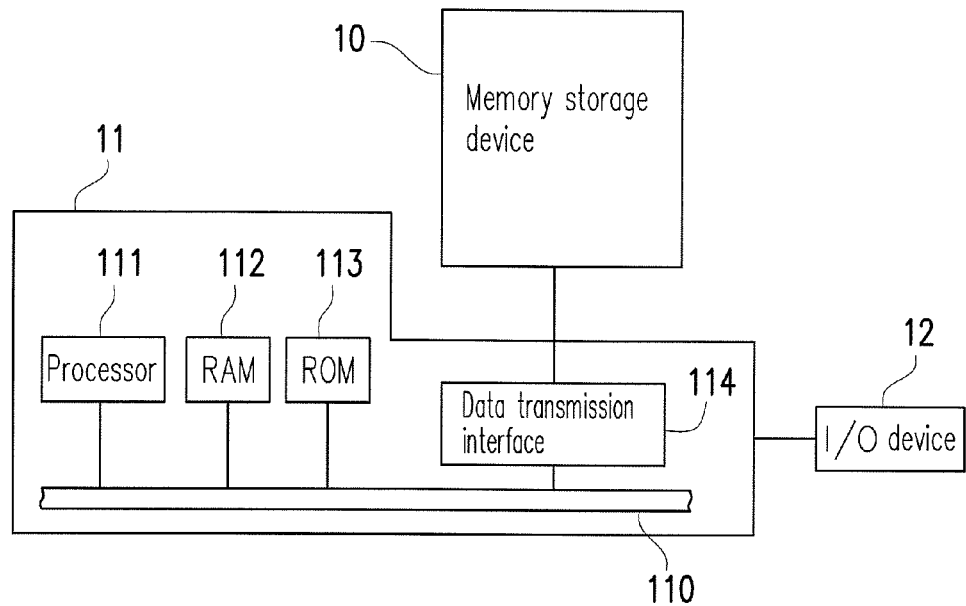
FIG. 1 is a schematic diagram of a host system, a memory storage device and an input/output (I/O) device according to an exemplary embodiment of the present disclosure.

Reference will now be made in detail to the present preferred embodiments of the disclosure, examples of which are illustrated in the accompanying drawings. Wherever possible, the same reference numbers are used in the drawings and the description to refer to the same or like parts.

Generally, a memory storage device (which is also referred to as a memory storage system) includes a rewritable non-volatile memory module and a controller (which is also referred to as a control circuit). The memory storage device is generally used together with a host system, and the host system can write data into the memory storage device and read data from the memory storage device.

Figure 2:
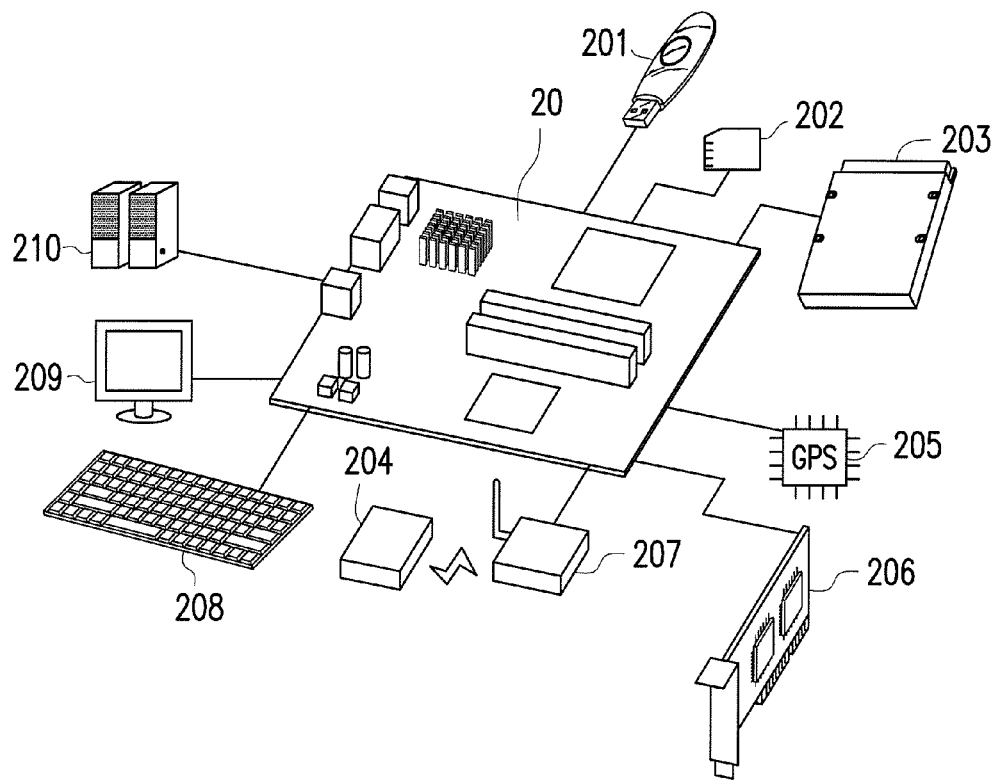
FIG. 2 is a schematic diagram of a host system, a memory storage device and an I/O device according to another exemplary embodiment of the present disclosure.

FIG. 1 is a schematic diagram of a host system, a memory storage device and an input/output (I/O) device according to an exemplary embodiment of the present disclosure. FIG. 2 is a schematic diagram of a host system, a memory storage device and an I/O device according to another exemplary embodiment of the present disclosure.

Referring to FIG. 1 and FIG. 2, the host system 11 generally includes a processor 111, a random access memory (RAM) 112, a read only memory (ROM) 113 and a data transmission interface 114. The processor 111, the RAM 112, the ROM 113 and the data transmission interface 114 are all coupled to a system bus 110.

In the present exemplary embodiment, the host system 11 is coupled to the memory storage device 10 through the data transmission interface 114. For example, the host system 11 may store data into the memory storage device 10 or read data from the memory storage device 10 through the data transmission interface 114. Moreover, the host system 11 is coupled to the I/O device 12 through the system bus 110. For example, the host system 11 may transmit an output signal to the I/O device 12 or receive an input signal from the I/O device 12 through the system bus 110.

In the present exemplary embodiment, the processor 111, the RAM 112, the ROM 113 and the data transmission interface 114 can be disposed on a motherboard 20 of the host system 11. The number of the data transmission interface 114 can be one or plural. The motherboard 20 can be coupled to the memory storage device 10 in a wired or wireless manner through the data transmission interface 114. The memory storage device 10 is, for example, a flash drive 201, a memory card 202, a solid state driver (SSD) 203 or a wireless memory storage device 204. The wireless memory storage device 204 is, for example, a memory storage device based on a wireless communication technique, such as a near field communication (NFC) memory storage device, a wireless fidelity (WiFi) memory storage device, a bluetooth memory storage device or a low power bluetooth memory storage device (for example, iBeacon), etc. Moreover, the motherboard 20 can also be coupled to various I/O devices such as a global positioning system (GPS) module 205, a network interface card 206, a wireless transmission device 207, a keyboard 208, a screen 209, a speaker 210, etc., through the system bus 110. For example, in an exemplary embodiment, the motherboard 20 may access the wireless memory storage device 204 through the wireless transmission device 207.

Figure 3:
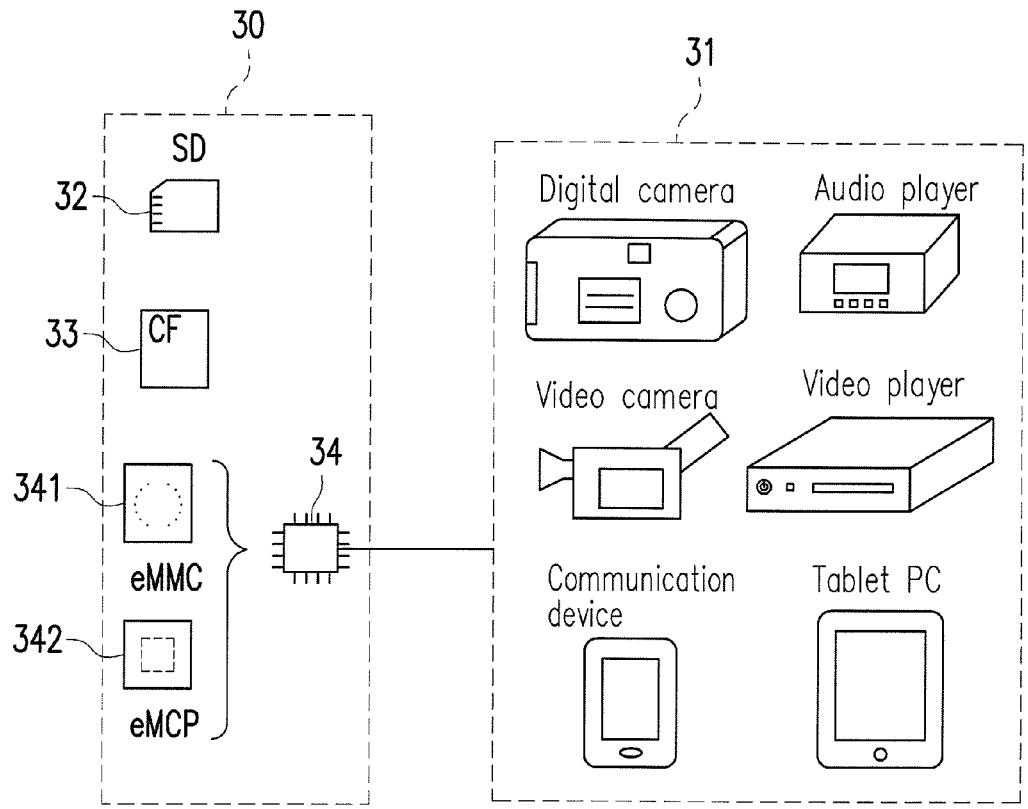
FIG. 3 is a schematic diagram of a host system and a memory storage device according to another exemplary embodiment of the present disclosure.

In an exemplary embodiment, the aforementioned host system can be any system substantially cooperated with the memory storage device to store data. In the aforementioned exemplary embodiment, the host system implemented by a computer system is taken as an example for description, however, FIG. 3 is a schematic diagram of a host system and a memory storage device according to another exemplary embodiment of the present disclosure. Referring to FIG. 3, in another exemplary embodiment, the host system 31 can also be a digital camera, a video camera, a communication device, an audio player, a video player or a tablet PC, etc., and the memory storage device 30 can be a non-volatile memory storage device such as a secure digital (SD) card 32, a compact flash (CF) card 33, or an embedded storage device 34, etc., used by the host system 31. The embedded storage device 34 includes an embedded multimedia card (eMMC) 341 and/or an embedded multi chip package (eMCP) storage device 342, etc., that is formed by directly coupling various memory modules to a substrate of the host system.

Figure 4:
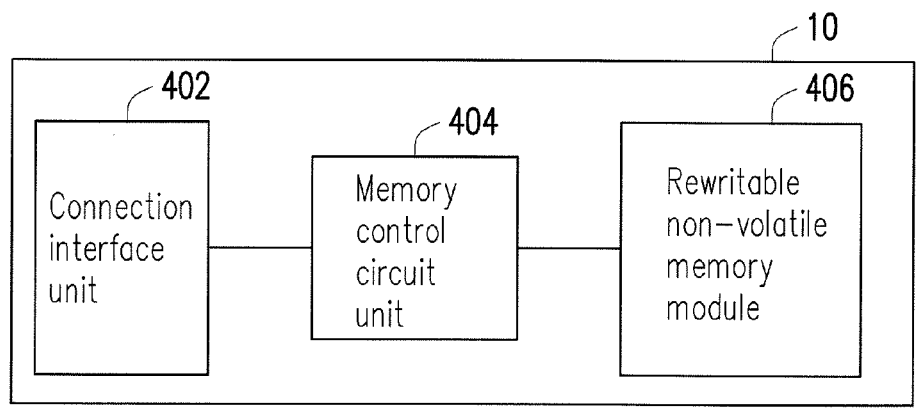
FIG. 4 is a schematic block diagram of a memory storage device according to an exemplary embodiment of the present disclosure.

FIG. 4 is a schematic block diagram of a memory storage device according to an exemplary embodiment of the present disclosure.

Referring to FIG. 4, the memory storage device 10 includes a connection interface unit 402, a memory control circuit unit 404 and a rewritable non-volatile memory module 406.

In the present exemplary embodiment, the connection interface unit 402 is complied with a serial advanced technology attachment (SATA) standard. However, it should be noted that the present disclosure is not limited thereto, and the connection interface unit 402 can also be complied with a parallel advanced technology attachment (PATA) standard, an institute of electrical and electronic engineers (IEEE) 1394 standard, a peripheral component interconnect (PCI) express standard, a universal serial bus (USB) standard, an SD interface standard, an ultra high speed-I (UHS-I) interface standard, an ultra high speed-II (UHS-II) interface standard, a memory stick (MS) interface standard, a multi-chip package interface standard, a multimedia card (MMC) interface standard, an eMMC interface standard, a universal flash storage (UFS) interface standard, an eMCP interface standard, a CF interface standard, an integrated device electronics (IDE) standard or other suitable standards. The connection interface unit 402 and the memory control circuit unit 404 can be packaged in one chip, or the connection interface unit 402 is configured outside a chip containing the memory control circuit unit 404.

The memory control circuit unit 404 may execute a plurality of logic gates or control instructions implemented in a hardware form or a firmware form, and may perform a writing operation, a reading operation or an erasing operation on the rewritable non-volatile memory module 406 according to commands of the host system 11.

The rewritable non-volatile memory module 406 is coupled to the memory control circuit unit 404 and is used for storing data written by the host system 11. The rewritable non-volatile memory module 406 can be a single level cell (SLC) NAND flash memory module (i.e., a flash memory module with one memory cell storing data of one bit), a multi level cell (MLC) NAND flash memory module (i.e., a flash memory module with one memory cell storing data of two bits), a triple level cell (TLC) NAND flash memory module (i.e., a flash memory module with one memory cell storing data of three bits), other flash memory modules or other memory modules having the same characteristic.

The memory cells in the rewritable non-volatile memory module 406 are arranged in an array. Memory cell arrays implemented in a two-dimensional array and a three-dimensional array in different exemplary embodiments are respectively described below. However, it should be noted that the memory cell arrays of the following embodiments are only examples, and in other exemplary embodiment, configuration of the memory cell array can be adjusted to meet an actual requirement.

Figure 5A:
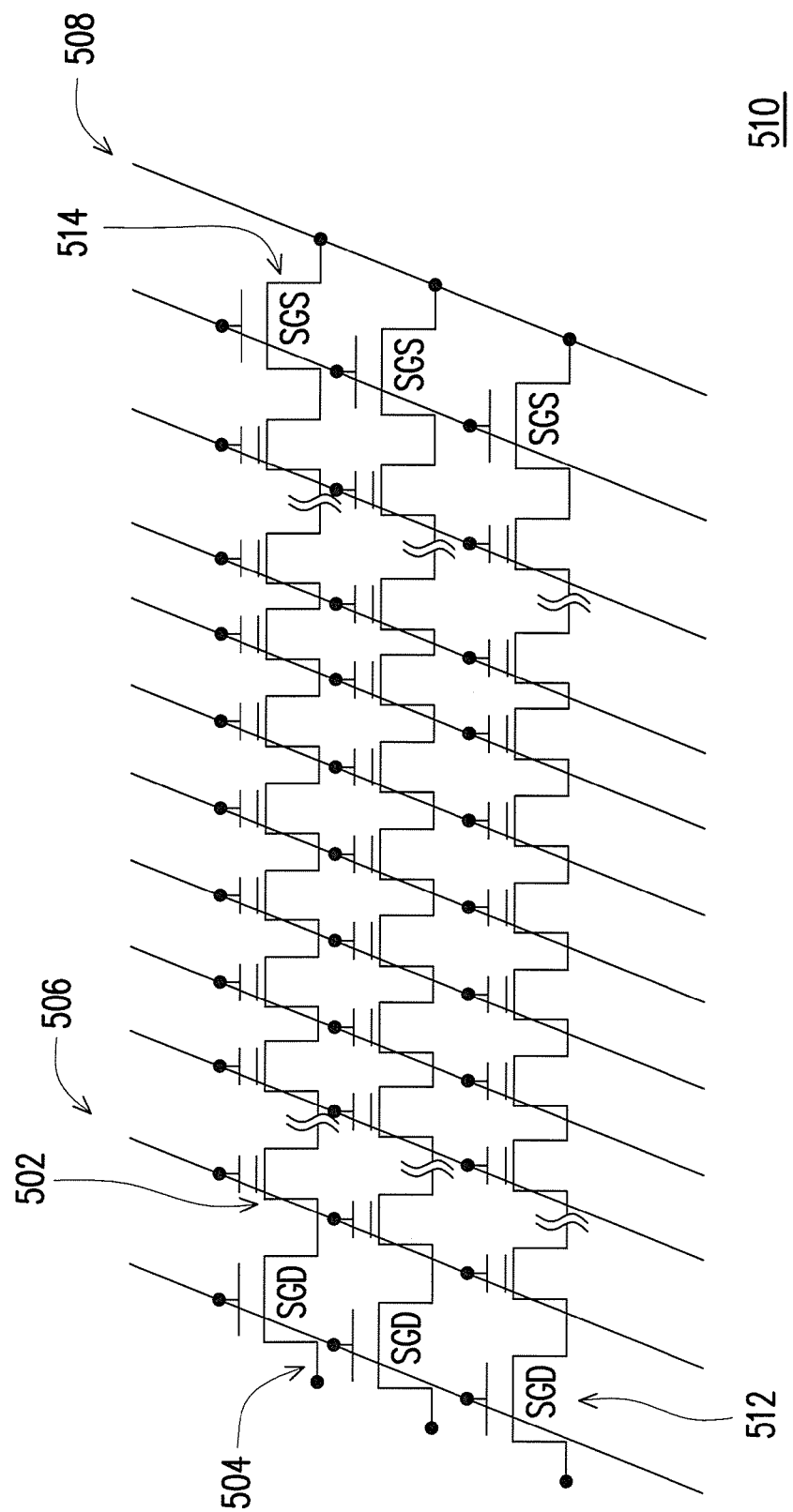
FIG. 5A is a schematic diagram of a memory cell array according to an exemplary embodiment of the present disclosure.

FIG. 5A is a schematic diagram of a memory cell array according to an exemplary embodiment of the present disclosure.

Referring to FIG. 5A, the memory cell array 510 includes a plurality of memory cells 502 used for storing data, a plurality of select gate drain (SGD) transistors 512 and a plurality of select gate source (SGS) transistors 514 and a plurality of bit lines 504, a plurality of word lines 506 and a common source line 508 connected to the memory cells. In the present exemplary embodiment, the memory cells 502 are configured at intersections of the bit lines 504 and the word lines 506 in an array.

Figure 5B:
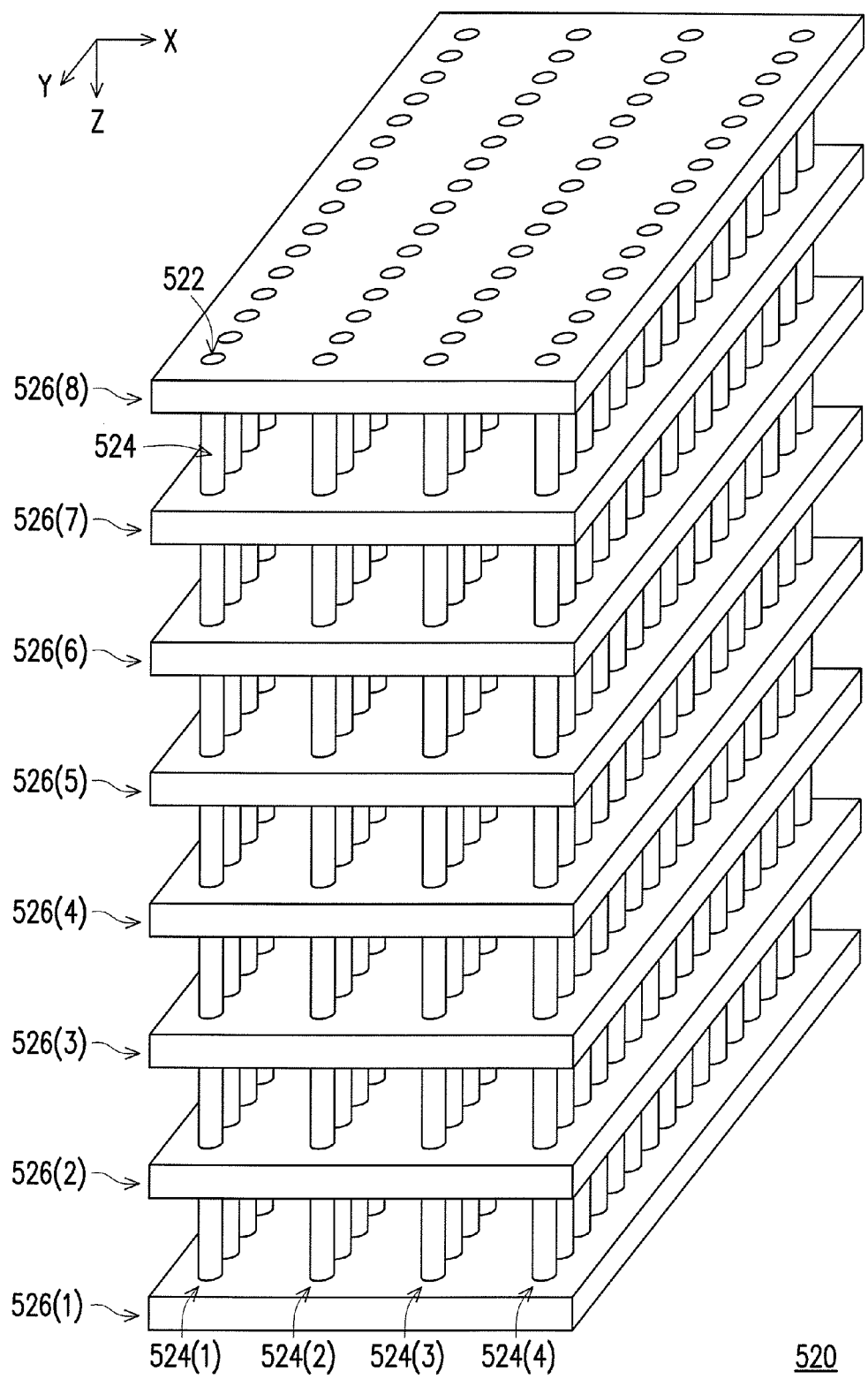
FIG. 5B is a schematic diagram of a memory cell array according to another exemplary embodiment of the present disclosure.

FIG. 5B is a schematic diagram of a memory cell array according to another exemplary embodiment of the present disclosure.

Referring to FIG. 5B, in the present exemplary embodiment, the memory cell array 520 includes a plurality of memory cells 522 used for storing data, a plurality of bit line sets 524(1)-524(4) and a plurality of word line layers 526(1)-526(8). The bit line sets 524(1)-524(4) are independent to each other (for example, separated from each other) and are arranged along a first direction (for example, an X-axis direction). Each of the bit line sets 524(1)-524(4) includes a plurality of bit lines 524 dependent to each other (for example, separated from each other). The bit lines 524 included in each of the bit line sets 524(1)-524(4) are arranged along a second direction (for example, a Y-axis direction) and extend along a third direction (for example, a Z-axis direction). The word line layers 526(1)-526(8) are independent to each other (for example, separated from each other) and are stacked along the third direction.

In the present exemplary embodiment, each of the word line layers 526(1)-526(8) can be regarded as a word line plane. Each memory cell 522 is configured at each intersection between the bit line sets 524(1)-524(4) and the word line layers 526(1)-526(8). However, in another exemplary embodiment, the memory cell array 520 may include more or less word line layers, and one bit line set may include more or less bit lines, and more or less bit line sets can be arranged to pass through each word line layer.

Each memory cell of the rewritable non-volatile memory module 406 stores one or a plurality of bits through variation of a voltage (which is also referred to as a threshold voltage hereinafter). To be specific, a control gate and a channel of each memory cell have a charge trapping layer therebetween. By applying a writing voltage to the control gate, an amount of electrons of the charge trapping layer can be changed, so as to change the threshold voltage of the memory cell. The procedure of changing the threshold voltage is referred to as "writing data into the memory cell" or "programming the memory cell". Along with the variation of the threshold voltage, each memory cell of the rewritable non-volatile memory module 406 has a plurality of storage states. By applying a reading voltage, the storage state of the memory cell can be determined, so as to obtain one or a plurality of bits stored in the memory cell.

Figure 6:
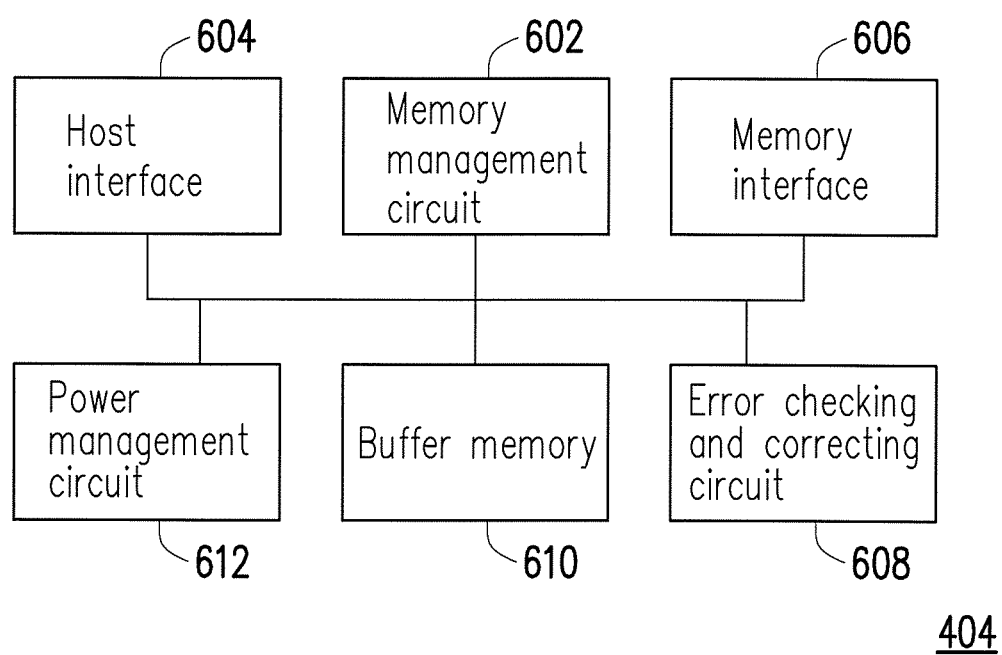
FIG. 6 is a schematic block diagram of a memory control circuit unit according to an exemplary embodiment of the present disclosure.

FIG. 6 is a schematic block diagram of a memory control circuit unit according to an exemplary embodiment of the present disclosure.

Referring to FIG. 6, the memory control circuit unit 404 includes a memory management circuit 602, a host interface 604, a memory interface 606 and an error checking and correcting circuit 608.

The memory management circuit 602 is configured to control a whole operation of the memory control circuit unit 404. To be specific, the memory management circuit 602 has a plurality of control instructions, and when the memory storage device 10 operates, these control instructions are executed to implement data writing, reading, erasing operations, etc. Following description of the operations of the memory management circuit 602 is equivalent to description of the operations of the memory control circuit unit 404.

In the present exemplary embodiment, the control instructions of the memory management circuit 602 are implemented in a firmware form. For example, the memory management circuit 602 has a micro processing unit (not shown) and a read-only memory (not shown), and these control instructions are burned in the read-only memory. When the memory storage apparatus 10 operates, these control instructions are executed by the micro processing unit to implement the data writing, reading, erasing operations, etc.

In another exemplary embodiment, the control instructions of the memory management circuit 602 may also be stored in a specific area (for example, a system area used for storing system data in the memory module) of the rewritable non-volatile memory module 406 as program codes. Moreover, the memory management circuit 602 has a micro processing unit (not shown), a read-only memory (not shown) and a random access memory (RAM) (not shown). Particularly, the read-only memory has a boot code, and when the memory control circuit unit 404 is enabled, the micro processing unit first runs the boot code to load the control instructions stored in the rewritable non-volatile memory module 406 to the RAM of the memory management circuit 602. Then, the micro processing unit executes these control instructions to implement the data writing, reading, erasing operations, etc.

Moreover, in another exemplary embodiment of the present disclosure, the control instructions of the memory management circuit 602 may also be implemented in a hardware form. For example, the memory management circuit 602 includes a micro controller, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are all coupled to the micro controller. The memory cell management circuit is used for managing memory cells of the rewritable non-volatile memory module 406 or groups thereof. The memory writing circuit is used for sending a writing command sequence to the rewritable non-volatile memory module 406 to write data into the rewritable non-volatile memory module 406. The memory reading circuit is used for sending a reading command sequence to the rewritable non-volatile memory module 406 to read data from the rewritable non-volatile memory module 406. The memory erasing circuit is used for sending an erasing command sequence to the rewritable non-volatile memory module 406 to erase data in the rewritable non-volatile memory module 406. The data processing circuit is used for processing data to be written into the rewritable non-volatile memory module 406 and data read from the rewritable non-volatile memory module 406. The writing command sequence, the reading command sequence and the erasing command sequence may respectively include one or a plurality of program codes or command codes and are used for instructing the rewritable non-volatile memory module 406 to execute the corresponding writing, reading, erasing operations, etc. In an exemplary embodiment, the memory management circuit 602 may further send other types of command sequences to the rewritable non-volatile memory module 406 to execute corresponding operations.

The host interface 604 is coupled to the memory management circuit 602 and is configured to receive and recognize commands and data transmitted by the host system 11. Namely, the commands and data transmitted by the host system 11 are transmitted to the memory management circuit 602 through the host interface 604. In the present exemplary embodiment, the host interface 604 is complied with the SATA standard. However, the present disclosure is not limited thereto, and the host interface 604 can also be complied with the PATA standard, the IEEE 1394 standard, the PCI express standard, the USB standard, the SD standard, the UHS-I standard, the UHS-II standard, the MS standard, the MMC standard, the eMMC standard, the UFS standard, the CF standard, the IDE standard or other suitable data transmission standards.

The memory interface 606 is coupled to the memory management circuit 602 and is configured to access the rewritable non-volatile memory module 406. Namely, data to be written into the rewritable non-volatile memory module 406 is converted into a format that can be accepted by the rewritable non-volatile memory module 406 through the memory interface 606. To be specific, when the memory management circuit 602 accesses the rewritable non-volatile memory module 406, the memory interface 606 sends corresponding command sequences. For example, the command sequences may include a writing command sequence indicating to write data, a reading command sequence indicating to read data, an erasing command sequence indicating to erase data, and corresponding command sequences indicating various memory operations (for example, to change a reading voltage level or execute a garbage collection procedure, etc.). These command sequences are, for example, generated by the memory management circuit 602, and are transmitted to the rewritable non-volatile memory module 406 through the memory interface 606. These command sequences may include one or a plurality of signals, or data on the bus. The signals or data may include command codes or program codes. For example, the reading command sequence may include information of an identification code, a memory address, etc. for reading.

The error checking and correcting circuit 608 is coupled to the memory management circuit 602 and is used for executing an error checking and correcting procedure to ensure correctness of data. To be specific, when the memory management circuit 602 receives a writing command from the host system 11, the error checking and correcting circuit 608 generates an error correcting code (ECC) and/or an error detecting code (EDC) for the data corresponding to the writing command, and the memory management circuit 602 writes the data corresponding to the writing command and the corresponding ECC and/or the EDC to the rewritable non-volatile memory module 406. Then, when the memory management circuit 602 reads data from the rewritable non-volatile memory module 406, the ECC and/or the EDC corresponding to the data are simultaneously read, and the error checking and correcting circuit 608 performs the error checking and correcting procedure on the read data according to the ECC and/or the EDC.

In the present exemplary embodiment, the error checking and correcting circuit 608 adopts a low density parity code (LDPC). However, in another exemplary embodiment, the error checking and correcting circuit 608 may also adopt a BCH code, a convolution code, a turbo code, a bit flipping coding/decoding algorithm, etc.

Figure 7:
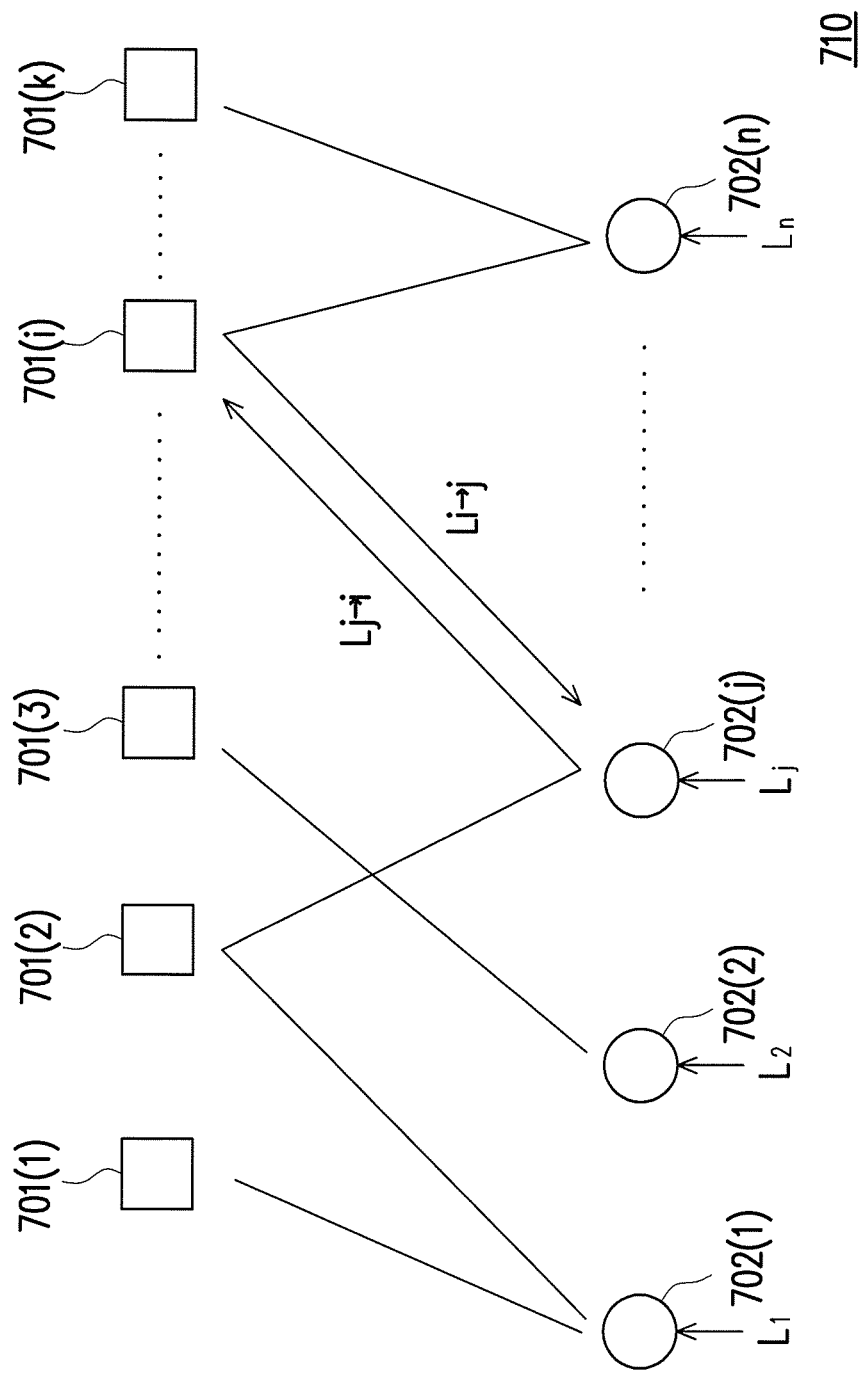
FIG. 7 is a schematic diagram of belief propagation of a low density parity code (LDPC) according to an exemplary embodiment of the present disclosure.

FIG. 7 is a schematic diagram of belief propagation of a LDPC according to an exemplary embodiment of the present disclosure.

Referring to FIG. 7, a decoding process of the LDPC can be represented by a belief propagation graph 710. The belief propagation graph 710 includes parity nodes 701(1)-710($k$) and message nodes 702(1)-702($n$). Each of the parity nodes 701(1)-710($k$) corresponds to a syndrome, and each of the message nodes 702(1)-702($n$) corresponds to a data bit in a currently decoded codeword. A corresponding relationship between the data bits and the syndromes (i.e., a connection relationship between the message nodes 702(1)-702($n$) and the parity nodes 701(1)-710($k$)) is generated according to a parity matrix adopted by the LDPC. To be specific, if an element at an $i^{th}$ row and $j^{th}$ column of the parity matrix is 1, the $i^{th}$ parity node 701($i$) is connected to the $j^{th}$ message node 702($j$), where i and j are positive integers.

When the memory management circuit 602 reads n data bits (forming a codeword) from the rewritable non-volatile memory module 406, the memory management circuit 602 (or the error checking and correcting circuit 608) also obtains channel reliability information of each data bit. The channel reliability information represents a probability (or a confidence level) that the corresponding data bit is decoded into bit "1" or "0". For example, in the belief propagation graph 710, the message nodes 702(1)-702($n$) receive the corresponding channel reliability information $L_1$-$L_n$. The message node 702(1) receives the channel reliability information $L_1$ of a $1^{st}$ data bit, and the message node 702($j$) receives the channel reliability information $L_j$ of a $j^{th}$ data bit. The error checking and correcting circuit 608 executes a decoding procedure according to a structure of the belief propagation graph 710 and the channel reliability information $L_1$-$L_n$.

In the present exemplary embodiment, the decoding procedure executed by the error checking and correcting circuit 608 is an iterative decoding procedure. In the iterative decoding procedure, the message nodes 702(1)-702($n$) calculate reliability information to the parity nodes 701(1)-710($k$), and the parity nodes 701(1)-710($k$) also calculate reliability information to the message nodes 702(1)-702($n$). The calculated reliability information can be transmitted along edges in the belief propagation graph 710. For example, the parity node 701($i$) transmits reliability information $L_{i \to j}$ to the message node 702($j$), and the message node 702($j$) transmits reliability information $L_{j \to i}$ to the parity node 701($i$). Certain reliability information represents a probability (or the aforementioned confidence level) that a data bit is decoded into bit "1" or "0" that is considered by one node. For example, the reliability information $L_{j \to i}$ represents a confidence level (which can be positive or negative) that the $j^{th}$ data bit is decoded into bit "1" or "0" that is considered by the message node 702($j$), and the reliability information $L_{i \to j}$ represents a confidence level (which can be positive or negative) that the $j^{th}$ data bit is decoded into bit "1" or "0" that is considered by the parity node 701($i$). The message nodes 702(1)-702($n$) and the parity nodes 701(1)-710($k$) may calculate output reliability information according to input reliability information, which is equivalent to calculate a condition probability that one data bit is decoded into bit "1" or "0". Therefore, the aforementioned process for transmitting the reliability information is also referred to as belief propagation.

In an exemplary embodiment, the reliability information (for example, the reliability information $L_{i \to j}$ and $L_{j \to i}$) transmitted between the nodes and the channel reliability information (for example, the channel reliability information $L_1$-$L_n$) actually used for decoding the data bits are all represented in log likelihood ratio (LLR). However, when different algorithms are adopted to update the reliability information and/or the channel reliability information in the iterative decoding procedure, the message nodes 702(1)-702($n$) and/or the parity nodes 701(1)-710($k$) may calculate the reliability information and/or the channel reliability information of different types/attributes. For example, the error checking and correcting circuit 608 may adopt a sum-product algorithm, a min-sum algorithm or a bit-flipping algorithm, etc., which is not limited by the present disclosure.

In the present exemplary embodiment, the iteration in the iterative decoding procedure is repeatedly executed, so as to update the channel reliability information corresponding to at least a part of the data bits. For example, in each iteration of the iterative decoding procedure, the message nodes 702(1)-702($n$) may transmit reliability information to the parity nodes 701(1)-710($k$), and the parity nodes 701(1)-710($k$) may transmit reliability information to the message nodes 702(1)-702($n$). In this way, the channel reliability information (for example, the channel reliability information $L_1$-$L_n$) actually used for decoding the data bits may probably be updated in any iteration. If a codeword generated through a certain iteration in the decoding procedure is a valid codeword, it represents that the decoding is successful, and the decoding procedure is stopped. If the generated codeword is not the valid codeword, a next iteration is performed. Moreover, if a total number of times for executing the iteration in certain decoding procedure reaches a predetermined threshold value, it represents that the decoding is failed, and the decoding procedure is also stopped.

In an exemplary embodiment, the memory control circuit unit 404 further includes a buffer memory 610 and a power management circuit 612.

The buffer memory 610 is coupled to the memory management circuit 602 and is used for temporarily storing data and commands from the host system 11, or data from the rewritable non-volatile memory module 406. The power management circuit 612 is coupled to the memory management circuit 602 and is used for controlling the power of the memory storage device 10.

In the present exemplary embodiment, the memory cells of the rewritable non-volatile memory module 406 construct a plurality of physical programming units, and the physical programming units construct a plurality of physical erasing unit. To be specific, the memory cells on a same word line (or a same word line layer) consist one or a plurality of physical programming units.

In an exemplary embodiment, if each memory cell is configured to store two bits, the physical programming units on the same word line (or the same word line layer) can be categorized into one lower physical programming unit and one upper physical programming unit. For example, a least significant bit (LSB) of one memory cell belongs to the lower physical programming unit, and a most significant bit (MSB) of one memory cell belongs to the upper physical programming unit. Generally, a writing speed of the lower physical programming unit is greater than that of the upper physical programming unit, and/or reliability of the lower physical programming unit is higher than that of the upper physical programming unit.

In another exemplary embodiment, if each memory cell is configured to store three bits, the physical programming units on the same word line (or the same word line layer) can be categorized into one lower physical programming unit, one upper physical programming unit and one extra physical programming unit. For example, an LSB of one memory cell belongs to the lower physical programming unit, a central significant bit (CSB) of one memory cell belongs to the upper physical programming unit, and an MSB of one memory cell belongs to the extra physical programming unit.

In the present exemplary embodiment, physical programming unit is the smallest unit for programming data. Namely, physical programming unit is the smallest unit for writing data. For example, the physical programming unit is a physical page or a physical sector. If the physical programming unit is physical page, each physical programming unit generally includes a data bit area and a redundant bit area. The data bit area includes a plurality of physical sectors and is configured for storing user data, and the redundant bit area is configured for storing system data (for example, error checking and correcting (ECC) codes). In the present exemplary embodiment, each data bit area includes 32 physical sectors, and the size of one physical sector is 512 bytes (B). However, in other exemplary embodiments, the data bit area may also include 8, 16 or more or less physical sectors, and the size of each physical sector can be larger or smaller. On the other hand, physical erasing unit is the smallest unit for erasing data. Namely, each physical erasing unit contains the least number of memory cells that are erased all together. For example, the physical erasing unit is a physical block.

In an exemplary embodiment, the memory management circuit 602 manages the memory cells of the rewritable non-volatile memory module 406 based on physical units. For example, in the following exemplary embodiment, one physical programming unit is taken as one physical unit. However, in another exemplary embodiment, one physical unit may also refer to one physical erasing unit or may consist of any number of memory cells, which is determined according to an actual requirement. Moreover, it should be noted that when the memory management circuit 602 groups the memory cells (or the physical units) in the rewritable non-volatile memory module 406, the memory cells (or the physical units) are logically grouped, and actual locations thereof are not changed.

Figure 8:
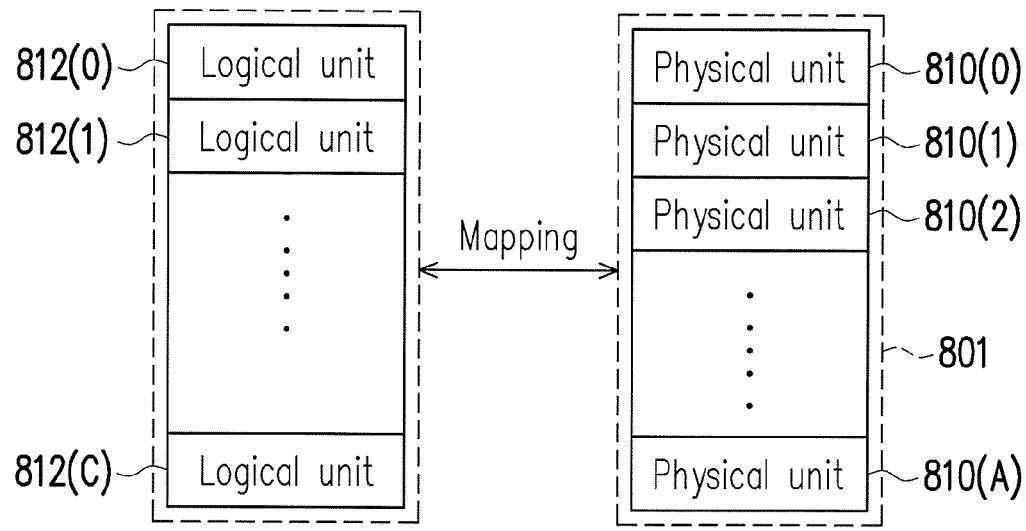
FIG. 8 is a schematic diagram for managing a rewritable non-volatile memory module according to an exemplary embodiment of the present disclosure.
Figure 8:
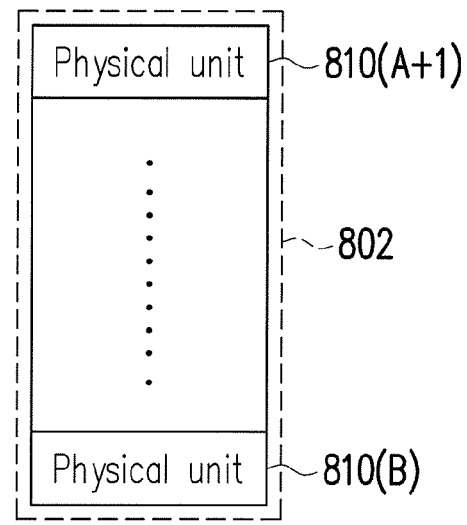

FIG. 8 is a schematic diagram for managing the rewritable non-volatile memory module according to an exemplary embodiment of the present disclosure.

Referring to FIG. 8, the memory management circuit 602 logically groups physical units 810(0)-810(B) of the rewritable non-volatile memory module 406 into a storage region 801 and a substitute region 802. The physical units 810(0)-810(A) in the storage region 801 are used for storing data, and the physical units 810(A+1)-810(B) in the substitute region 802 are used for substituting damaged physical units in the storage region 801.

In the present exemplary embodiment, the memory management circuit 602 configures logical units 812(0)-812(C) for mapping at least a part of the physical units 810(0)-810(A) in the storage region 801. In the present exemplary embodiment, the host system 11 accesses data stored in the storage region 801 through logical addresses (LA). Therefore, each of the logical units 812(0)-812(C) refers to one logical address. However, in another exemplary embodiment, each of the logical units 812(0)-812(C) may refer to one logical programming unit, one logical erasing unit or consist of a plurality of continuous or discontinuous logical addresses, which is determined according to an actual requirement. Moreover, each of the logical units 812(0)-812(C) can also be mapped to one or a plurality of physical units.

In the present exemplary embodiment, the memory management circuit 602 executes a channel reliability information updating procedure at a specific time point, so as to update the channel reliability information corresponding to a specific physical unit. In an exemplary embodiment, the specific time point includes at least one of a time point when the memory storage device 10 is booted, a time point when the memory storage device 10 is normally turned off, a time point when the memory storage device 10 is suddenly power off and a time point when an idle time of the memory storage device 10 exceeds a predetermined time. In an exemplary embodiment, the specific time point can also be a periodic time point. For example, the channel reliability information updating procedure is executed every a period of time (for example, one week). In an exemplary embodiment, the specific time point can be a time point when at least one of a bit error rate, an erasing count, a writing count, a reading count and a data storage time of a certain physical unit exceeds a corresponding predetermined value. In an exemplary embodiment, the specific time point can also be a time point when the aforementioned specific physical unit is erased. In an exemplary embodiment, the specific time point can also be a time point when the aforementioned specific physical unit is erased and is again used for storing data from the host system 11. In an exemplary embodiment, the specific time point can also be a time point when the aforementioned specific physical unit is selected from the substitute region 802 to substitute a damaged physical unit of the storage region 801. In an exemplary embodiment, the specific time point can also be a time point when a certain iteration decoding procedure executed on the data stored in the aforementioned specific physical unit is failed.

In the channel reliability information updating procedure, the memory management circuit 602 sends a writing command sequence to the rewritable non-volatile memory module 406. The writing command sequence instructs the rewritable non-volatile memory module 406 to program data (which is also referred to as first data) to at least one of the physical units 810(0)-810(A) (which is also referred to as a first physical unit). Then, the memory management circuit 602 sends a reading command sequence to the rewritable non-volatile memory module 406. The reading command sequence instructs the rewritable non-volatile memory module 406 to read the first physical unit to obtain another data (which is also referred to as second data).

The memory management circuit 602 obtains a threshold voltage distribution (which is also referred to as a first threshold voltage distribution hereinafter) corresponding to a bit value (which is also referred to as a first bit value hereinafter) and another threshold voltage distribution (which is also referred to as a second threshold voltage distribution hereinafter) corresponding to another bit value (which is also referred to as a second bit value hereinafter) according to the first data and the second data, where the first bit value is different from the second bit value. In the present exemplary embodiment, the first bit value is "1", and the second bit value is "0". Namely, the first threshold voltage distribution is the threshold voltage distribution of the memory cells storing the bit "1" of the first physical units, and the second threshold voltage distribution is the threshold voltage distribution of the memory cells storing the bit "0" of the first physical units.

The memory management circuit 602 calculates channel reliability information (which is also referred to as first channel reliability information hereinafter) corresponding to the first physical unit according to the first threshold voltage distribution and the second threshold voltage distribution. Thereafter, when the first physical unit is used for storing other data (which is also referred to as third data) coming from the host system 11 and the third data is read out from the first physical unit, the error checking and correcting circuit 608 decodes the third data according to the first channel reliability information. Since the first channel reliability information is calculated according to the "real" first threshold voltage distribution and the "real" second threshold voltage distribution of the first physical unit, the efficiency that the error checking and correcting circuit 608 decodes the third data according to the first channel reliability information may be improved.

Figure 9:
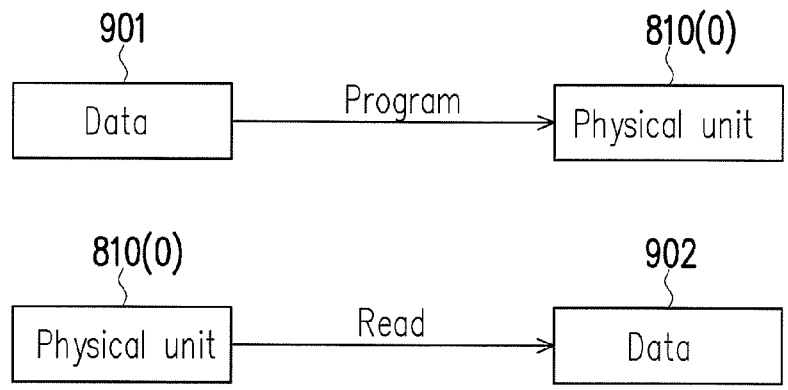
FIG. 9 is a schematic diagram of data programming and data reading according to an exemplary embodiment of the present disclosure.
Figure 10:
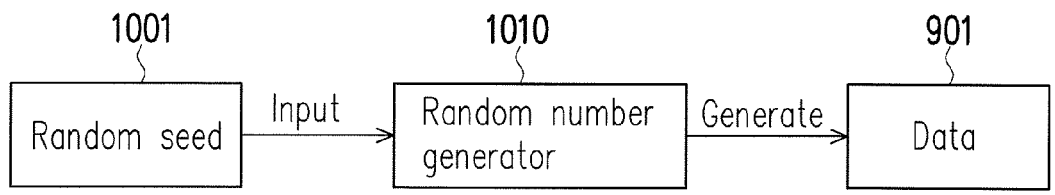
FIG. 10 is a schematic diagram of generating data by a random number generator according to an exemplary embodiment of the present disclosure.
Figure 11:
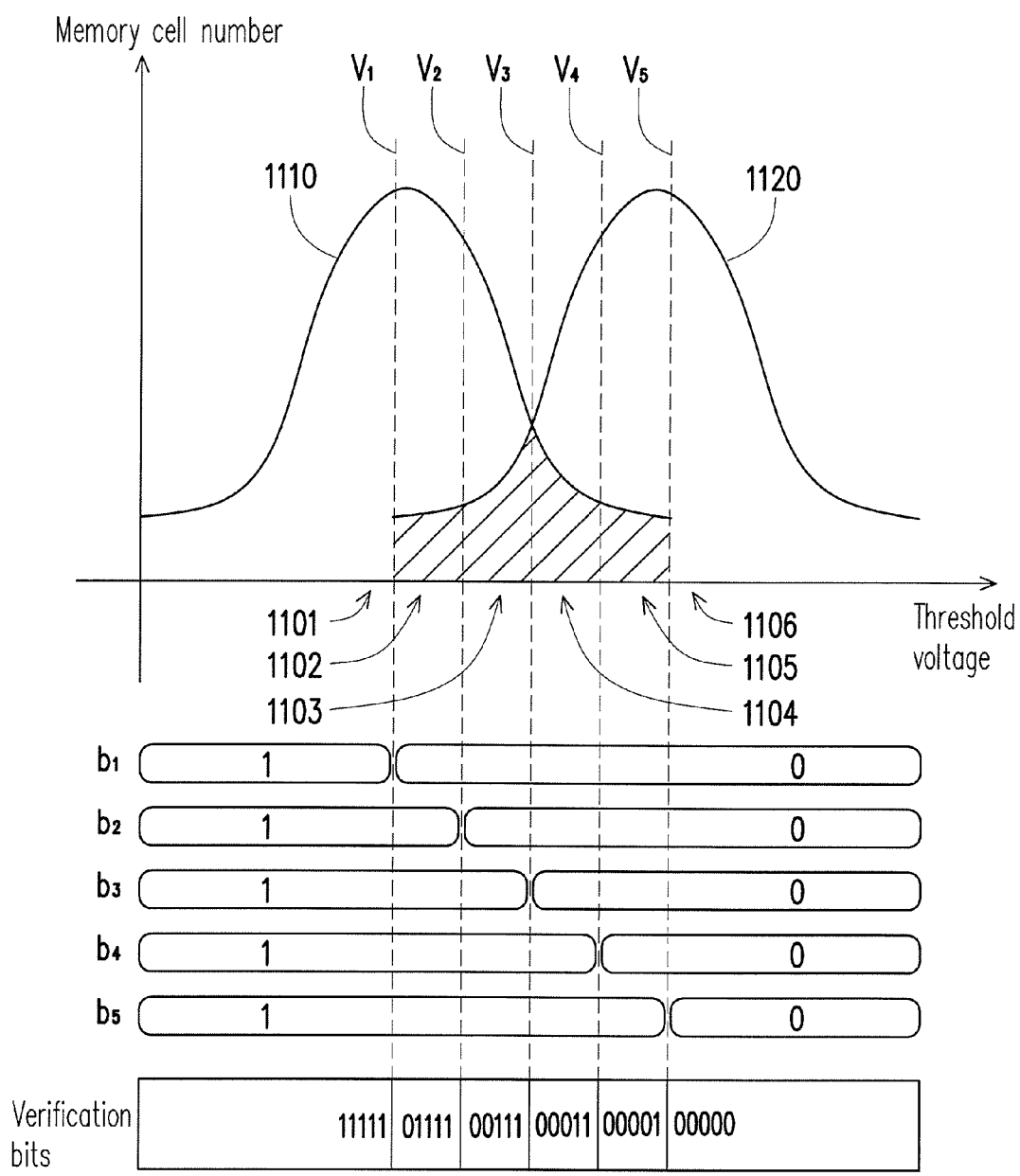
FIG. 11 is a schematic diagram of threshold voltage distributions and verification bits according to an exemplary embodiment of the present disclosure.
Figures 12, 13:
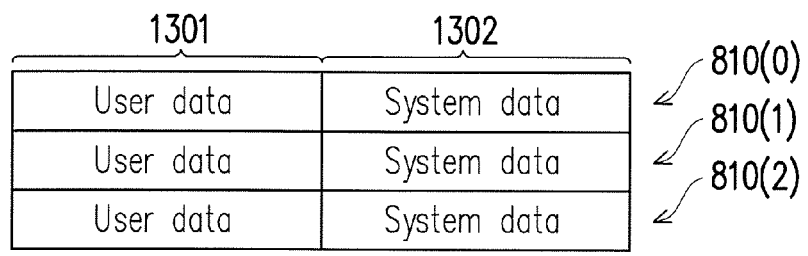
FIG. 12 is a schematic diagram of voltage regions and corresponding channel reliability information according to an exemplary embodiment of the present disclosure.
FIG. 13 is a schematic diagram of physical units according to an exemplary embodiment of the present disclosure.

FIG. 9 is a schematic diagram of data programming and data reading according to an exemplary embodiment of the present disclosure. FIG. 10 is a schematic diagram of generating data by a random number generator according to an exemplary embodiment of the present disclosure. FIG. 11 is a schematic diagram of threshold voltage distributions and verification bits according to an exemplary embodiment of the present disclosure. FIG. 12 is a schematic diagram of voltage regions and corresponding channel reliability information according to an exemplary embodiment of the present disclosure.

Referring to FIG. 9, at a specific time point, the memory management circuit 602 executes a channel reliability information updating procedure corresponding to the physical unit 810(0). In the channel reliability information updating procedure, the memory management circuit 602 instructs to program data 901 (i.e., the first data) to the physical unit 810(0).

Referring to FIG. 10, in the present exemplary embodiment, before programming the data 901 to the physical unit 810(0), the memory management circuit 602 inputs a random seed 1001 to a random number generator 1010 to generate the data 901. Namely, in the present exemplary embodiment, the data 901 is random data. The random number generator 1010 can be a scrambler and can be implemented by a software module and/or a hardware circuit. In the present exemplary embodiment, the memory management circuit 602 stores the random seed 1001. In this way, after programming the data 901 to the physical unit 810(0), the memory management circuit 602 again uses the random seed 1001 to generate the same data 901. In another exemplary embodiment, the memory management circuit 602 may directly store the data 901 for the subsequent use of calculating the first channel reliability information. In another exemplary embodiment, the data 901 can also be any data that is not generated by the random number generator 1010 or data coming from the host system 11. Moreover, in different channel reliability information updating procedures, the used random seeds 1001 and/or the data 901 can be the same or different, which is not limited by the present disclosure. For example, the random seed 1001 and/or the data 901 used in a certain channel reliability information updating procedure can also be used in other channel reliability information updating procedure.

Referring to FIG. 9, after programming the data 901 to the physical unit 810(0), the memory management circuit 602 instructs to read the physical unit 810(0) storing the data 901 to obtain data 902 (i.e., the second data).

Referring to FIG. 11, it is assumed that after programming the data 901 to the physical unit 810(0), the threshold voltage distribution of the memory cell storing the data 902 in the physical unit 810(0) includes threshold voltage distributions 1110 and 1120. The threshold voltage distribution 1110 is the threshold voltage distribution (i.e., the first threshold voltage distribution) of the memory cell (which is also referred to as a first memory cell hereinafter) each storing a bit "1", and the threshold voltage distribution 1120 is the threshold voltage distribution (i.e., the second threshold voltage distribution) of the memory cell (which is also referred to as a second memory cell hereinafter) each storing a bit "0". The memory management circuit 602 obtains the threshold voltage distribution 1110 and 1120 according to the data 901 and the data 902.

To be specific, in the operation of reading the data 902, the memory management circuit 602 instructs to use a plurality of reading voltages $V_1$-$V_5$ to read the memory cells storing the data 902 in the physical unit 810(0), so as to obtain a plurality of verification bits $b_1$-$b_5$. In an exemplary embodiment, the verification bits $b_1$-$b_5$ are also referred to as soft bits or soft information. Comparatively, in another exemplary embodiment, if the memory cells are read by only using one of the reading voltages $V_1$-$V_5$, only one of the verification bits $b_1$-$b_5$ is obtained, and the single validation bit is also referred to as a hard bit or hard information.

In an exemplary embodiment, a decoding procedure executed based on a plurality of verification bits (for example, the verification bits $b_1$-$b_5$) is also referred to as a soft decoding procedure, and a decoding procedure executed based on a single validation bit is also referred to as a hard decoding procedure. Generally, error correcting capability of the soft decoding procedure is better than error correcting capability of the hard decoding procedure, though a decoding speed of the hard decoding procedure is higher than a decoding speed of the soft decoding procedure. Therefore, in an exemplary embodiment, when certain data (for example, a certain codeword) is to be decoded, the error checking and correcting circuit 608 may first execute the hard decoding procedure, and if the hard decoding procedure is failed, the error checking and correcting circuit 608 continually executes the soft decoding procedure. In an exemplary embodiment, the specific time point for executing the channel reliability information updating procedure can also be a time point when the hard decoding procedure is failed or the soft decoding procedure is failed.

Referring back to FIG. 11, after the verification bits $b_1$-$b_5$ are obtained, the memory management circuit 602 groups a threshold voltage of each memory cell storing the data 902 in the physical unit 810(0) into one of a plurality of voltage regions 1101-1106. For example, it is assumed that after a certain memory cell is read by using the reading voltages $V_1$-$V_5$, the verification bits $b_1$-$b_5$ transmitted back by the memory cell in response to the reading voltages $V_1$-$V_5$ are "11111", the memory management circuit 602 groups the threshold voltage of the memory cell to the voltage region 1101; it is assumed that after a certain memory cell is read by using the reading voltages $V_1$-$V_5$, the verification bits $b_1$-$b_5$ transmitted back by the memory cell in response to the reading voltages $V_1$-$V_5$ are "01111", the memory management circuit 602 groups the threshold voltage of the memory cell to the voltage region 1102; it is assumed that after a certain memory cell is read by using the reading voltages $V_1$-$V_5$, the verification bits $b_1$-$b_5$ transmitted back by the memory cell in response to the reading voltages $V_1$-$V_5$ are "00111", the memory management circuit 602 groups the threshold voltage of the memory cell to the voltage region 1103; it is assumed that after a certain memory cell is read by using the reading voltages $V_1$-$V_5$, the verification bits $b_1$-$b_5$ transmitted back by the memory cell in response to the reading voltages $V_1$-$V_5$ are "00011", the memory management circuit 602 groups the threshold voltage of the memory cell to the voltage region 1104; it is assumed that after a certain memory cell is read by using the reading voltages $V_1$-$V_5$, the verification bits $b_1$-$b_5$ transmitted back by the memory cell in response to the reading voltages $V_1$-$V_5$ are "00001", the memory management circuit 602 groups the threshold voltage of the memory cell to the voltage region 1105; it is assumed that after a certain memory cell is read by using the reading voltages $V_1$-$V_5$, the verification bits $b_1$-$b_5$ transmitted back by the memory cell in response to the reading voltages $V_1$-$V_5$ are "00000", the memory management circuit 602 groups the threshold voltage of the memory cell to the voltage region 1106.

After the grouping is completed, the memory management circuit 602 counts a total number (which is also referred to as a first total number hereinafter) of the memory cells belonging to the threshold voltage distribution 1110 (i.e., the first memory cells each actually storing the bit "1") among the memory cells grouped to each of the voltage regions 1101-1106 according to the data 901. Meanwhile, the memory management circuit 602 counts another total number (which is also referred to as a second total number hereinafter) of the memory cells belonging to the threshold voltage distribution 1120 (i.e., the second memory cells each actually storing the bit "0") among the memory cells grouped to each of the voltage regions 1101-1106 according to the data 901. Then, the memory management circuit 602 calculates the first channel reliability information according to the first total number and the second total number.

Referring to FIG. 12, it is assumed that in the memory cells belonging to the threshold voltage distribution 1120, the total numbers of the memory cells (with the threshold voltages) grouped to the voltage regions 1101-1106 are respectively "5", "6", "9", "72", "309" and "18031", and in the memory cells belonging to the threshold voltage distribution 1110, the total numbers of the memory cells (with the threshold voltages) grouped to the voltage regions 1101-1106 are respectively "17497", "230", "208", "189", "124" and "184", the memory management circuit 602 may respectively calculate the channel reliability information of the memory cells corresponding to the six voltage regions 1101-1106 to be "−8", "−4", "−3", "−1", "1" and "5". The above channel reliability information belongs to the first channel reliability information. Then, when the memory cells are used for storing other data (i.e., the third data) and the data is read out, the channel reliability information "−8", "−4", "−3", "−1", "1" and "5" can be respectively used for decoding the data read from the corresponding memory cell.

In an exemplary embodiment, the memory management circuit 602 may calculate the aforementioned first channel reliability information according to a following equation (1):

$$LLR(y) = \log\left(\frac{cnt(x = 0 \mid y)}{cnt(x = 1 \mid y)}\right) \quad (1)$$

Where, y represents a certain one of the voltage regions 1101-1106, cnt(x=1|y) represents a total number of the first memory cells (the memory cells each actually storing the bit "1") in the voltage region y, cnt(x=0|y) represents a total number of the second memory cells (the memory cells each actually storing the bit "0") in the voltage region y, and LLR(y) represents the channel reliability information corresponding to all of the memory cells in the voltage region y. However, in another exemplary embodiment, after the first total number and the second total number are obtained, the first channel reliability information can also be calculated by adopting any algorithm, and the present disclosure is not limited to the equation (1).

In an exemplary embodiment, after the aforementioned first channel reliability information is obtained, the first channel reliability information is probably not directly used by the error checking and correcting circuit 608. For example, the memory management circuit 602 inquires a look-up table according to the first channel reliability information to obtain predetermined channel reliability information recorded in the look-up table. Thereafter, the error checking and correcting circuit 608 decodes the third data according to the predetermined channel reliability information.

In an exemplary embodiment, the first data can be further used to update the channel reliability information corresponding to the other physical unit not storing the first data. For example, in an exemplary embodiment, the memory management circuit 602 selects one of a plurality of channel reliability information sets according to the calculated first channel reliability information. For example, the channel reliability information sets are recorded in a look-up table. The memory management circuit 602 seeks and selects a specific channel reliability information set from the channel reliability information sets. For example, the selected channel reliability information set probably contains channel reliability information the same or similar to the first channel reliability information (or the aforementioned predetermined channel reliability information). The memory management circuit 602 may obtain channel reliability information (which is also referred to as second channel reliability information) corresponding to another at least one physical unit (which is also referred to as second physical unit) from the selected channel reliability information set. For example, the second channel reliability information is recorded in the selected channel reliability information set. Then, the error checking and correcting circuit 608 executes the decoding procedure corresponding to the second physical unit according to the second channel reliability information, so as to decode data (which is also referred to as fourth data) stored in the second physical unit.

In an exemplary embodiment, the first physical unit and the second physical unit are located on a same word line or a same word line layer. For example, if the first physical unit is a lower physical programming unit on a certain word line, the second physical unit can be an upper physical programming unit and/or extra physical programming unit on the same word line.

FIG. 13 is a schematic diagram of physical units according to an exemplary embodiment of the present disclosure.

Referring to FIG. 13, the physical units 810(0)-810(2) are located on a same word line or a same word line layer. The physical unit 810(0) is the lower physical programming unit, the physical unit 810(1) is the upper physical programming unit, and the physical unit 810(2) is the extra physical programming unit. The physical units 810(0)-810(2) respectively include a data bit region 1301 and a redundant bit region 1302. The data bit region 1301 and the redundant bit region 1302 of each of the physical units 810(0)-810(2) are respectively used for storing the user data coming from the host system 11 and the corresponding system data (for example, ECC).

In an exemplary embodiment, a storage position of the first data can be the data bit region 1301 and/or the redundant bit region 1302 of at least one of the physical units 810(0)-810(2). In an exemplary embodiment of FIG. 13, the first data is only stored in the physical unit 810(0). For example, the first data is probably only stored in the data bit region 1301 of the physical unit 810(0), only stored in the redundant bit region 1302 of the physical unit 810(0), or simultaneously stored in the data bit region 1301 of the physical unit 810(0) and the redundant bit region 1302 of the physical unit 810(0). A data size of the first data can be equal to or smaller than a capacity of one data bit region 1301, equal to or smaller than a capacity of one redundant bit region 1302, or equal to a capacity of the entire physical unit 810(0).

After the channel reliability information corresponding to the physical unit 810(0) is calculated by using the first data stored in the physical unit 810(0), the memory management circuit 602 may inquire the channel reliability information corresponding to the physical unit 810(1) and/or the channel reliability information corresponding to the physical unit 810(2) from a certain channel reliability information set. Moreover, in an exemplary embodiment, the first data can also be stored in the physical unit 810(1) and/or the physical unit 810(2), and can be used for calculating the channel reliability information corresponding to the physical unit not storing the first data among the physical units 810(0)-810(2).

In an exemplary embodiment, after the first channel reliability information (or the aforementioned predetermined channel reliability information) corresponding to the first physical unit is obtained, the first channel reliability information (or the aforementioned predetermined channel reliability information) may also be directly corresponded to a specific physical unit (which is also referred to as the third physical unit). For example, a usage level of the third physical unit and a usage level of the first physical unit belong to a same usage level range. For example, a certain usage level range may be that the erasing count is greater than 0 and smaller than 250, and another usage level range may be that the erasing count is greater than 250 and smaller than 500, etc. The usage level range can also be determined according to an actual requirement. For example, the usage level range may relate to the bit error rate, the writing count, the reading count and the data storage time, etc.

Figure 14:
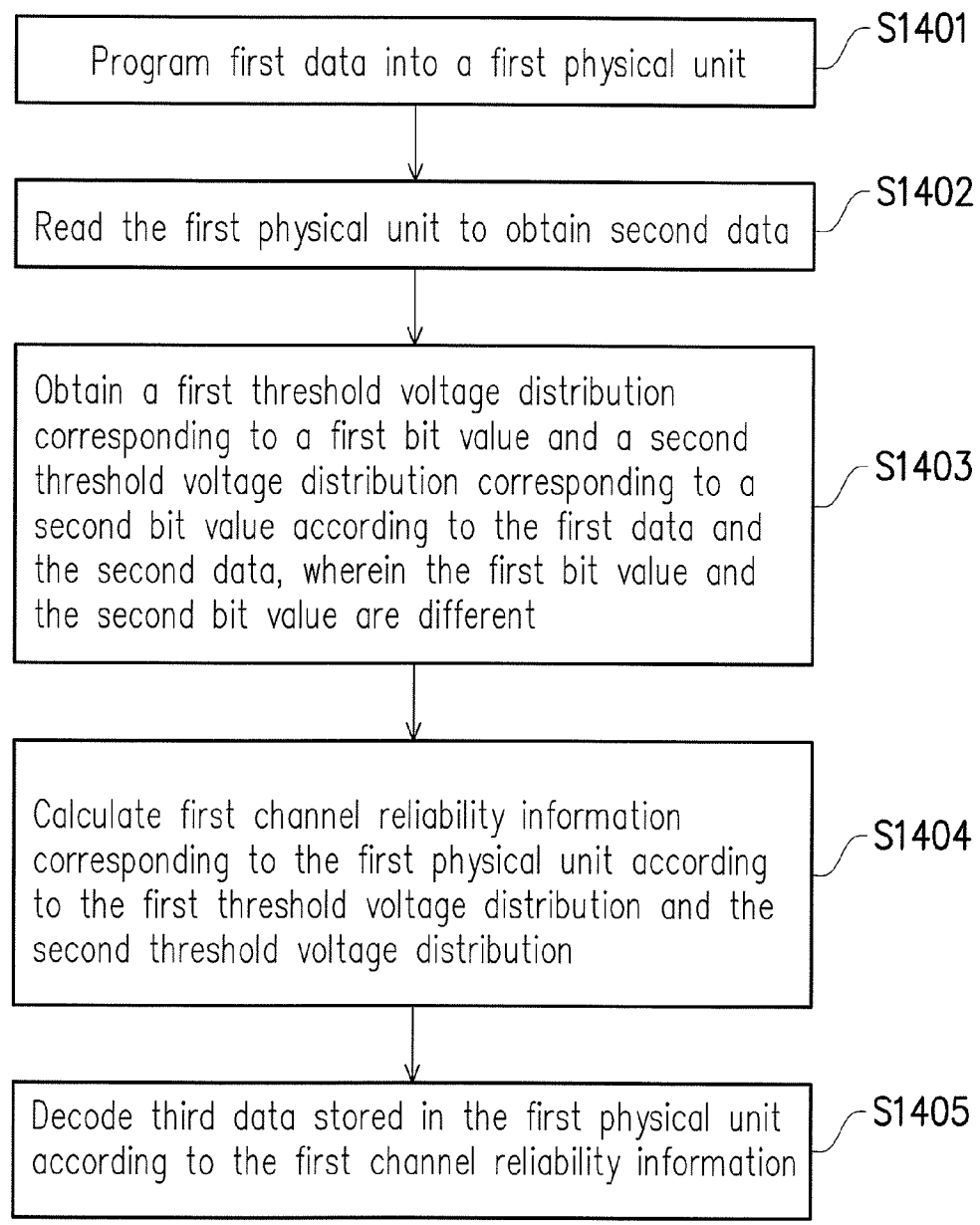
FIG. 14 is a flowchart illustrating a decoding method according to an exemplary embodiment of the present disclosure.

FIG. 14 is a flowchart illustrating a decoding method according to an exemplary embodiment of the present disclosure.

Referring to FIG. 14, in step S1401, first data is programmed into a first physical unit. In step S1402, the first physical unit is read to obtain second data. In step S1403, a first threshold voltage distribution corresponding to a first bit value and a second threshold voltage distribution corresponding to a second bit value are obtained according to the first data and the second data, where the first bit value and the second bit value are different. In step S1404, first channel reliability information corresponding to the first physical unit is calculated according to the first threshold voltage distribution and the second threshold voltage distribution. In step S1405, third data stored in the first physical unit is decoded according to the first channel reliability information.

However, the various steps of FIG. 14 have been described in detail in the aforementioned description, so that details thereof are not repeated. It should be noted that the various steps of FIG. 14 can be implemented as a plurality of program codes or circuits, which is not limited by the present disclosure. Moreover, the method of FIG. 14 can be used in collaboration with the aforementioned exemplary embodiments, and can also be used independently, which is not limited by the present disclosure.

In summary, after storing the first data to the first physical unit and reading the first physical unit to obtain the second data, by analysing the first data and the second data, the first threshold voltage distribution corresponding to the first bit value and the second threshold voltage distribution corresponding to the second bit value are obtained. The first channel reliability information corresponding to the first physical unit is obtained according to the first threshold voltage distribution and the second threshold voltage distribution. Then, the data stored in the first physical unit is decoded according to the first channel reliability information, so as to improve the decoding efficiency. Moreover, after the first channel reliability information is obtained, the first channel reliability information can be directly applied to the other physical units with usage levels the same to that of the first physical unit and/or the other physical units belonging to the same word line (or word line layer) with that of the first physical unit, so as to improve the updating efficiency of the channel reliability information.

The previously described exemplary embodiments of the present disclosure have the advantages aforementioned, wherein the advantages aforementioned not required in all versions of the disclosure.

It will be apparent to those skilled in the art that various modifications and variations can be made to the structure of the present disclosure without departing from the scope or spirit of the present disclosure. In view of the foregoing, it is intended that the present disclosure cover modifications and variations of this present disclosure provided they fall within the scope of the following claims and their equivalents.

What is claimed is:

1. A decoding method comprising:
    sending, via a memory interface, a writing command sequence containing instructions to program first data into at least one first physical unit among a plurality of physical units of a rewritable non-volatile memory module;
    sending, via the memory interface, a reading command sequence containing instructions to read the at least one first physical unit to obtain second data;
    obtaining, by a memory management circuit, a first threshold voltage distribution corresponding to a first bit value and a second threshold voltage distribution corresponding to a second bit value by analyzing the first data and the second data, wherein the first bit value and the second bit value are different;
    calculating, by the memory management circuit, first channel reliability information corresponding to the at least one first physical unit according to the first threshold voltage distribution and the second threshold voltage distribution;
    sending, via the memory interface, a writing command sequence containing instructions to program third data received from a host system to the at least one first physical unit; and
    decoding, by an error checking and correcting circuit, the third data stored in the at least one first physical unit according to the first channel reliability information when the third data is read from the at least one first physical unit.

2. The decoding method as claimed in claim 1, further comprising:
inputting a random seed into a random number generator to generate the first data, and storing at least one of the random seed and the first data.

3. The decoding method as claimed in claim 1, wherein the steps of obtaining the first threshold voltage distribution and the second threshold voltage distribution and calculating the first channel reliability information comprise:
grouping a threshold voltage of each memory cell of the at least one first physical unit stored with the first data into one of a plurality of voltage regions according to the second data;
counting a first total number of first memory cells belonging to the first threshold voltage distribution among the memory cells grouped to each of the voltage regions according to the first data;
counting a second total number of second memory cells belonging to the second threshold voltage distribution among the memory cells grouped to each of the voltage regions according to the first data; and
calculating the first channel reliability information according to the first total number and the second total number.

4. The decoding method as claimed in claim 1, wherein the step of decoding the third data according to the first channel reliability information comprises:
inquiring a look-up table by using the first channel reliability information to obtain predetermined channel reliability information, wherein the predetermined channel reliability information is previously recorded in the look-up table; and
decoding the third data according to the predetermined channel reliability information.

5. The decoding method as claimed in claim 1, further comprising:
selecting one of a plurality of channel reliability information sets according to the first channel reliability information, wherein the channel reliability information sets are previously recorded in a look-up table;
obtaining second channel reliability information corresponding to at least one second physical unit from the selected channel reliability information set;
storing fourth data received from the host system to at least one second physical unit; and
decoding the fourth data stored in the at least one second physical unit according to the second channel reliability information when the fourth data is read from the at least one second physical unit.

6. The decoding method as claimed in claim 5, wherein the at least one first physical unit and the at least one second physical unit are located on a same word line or a same word line layer.

7. The decoding method as claimed in claim 1, wherein the at least one physical unit comprises a data bit region and a redundant bit region,
wherein the first data is stored in at least one of the data bit region and the redundant bit region.

8. A memory storage device, comprising:
a connection interface unit, coupled to a host system;
a rewritable non-volatile memory module, comprising a plurality of physical units; and
a memory control circuit unit, coupled to the connection interface unit and the rewritable non-volatile memory module,
wherein the memory control circuit unit is configured to send a writing command sequence, wherein the writing command sequence contains instructions to program first data into at least one first physical unit among the physical units,
wherein the memory control circuit unit is configured to send a reading command sequence, wherein the reading command sequence contains instructions to read the at least one first physical unit to obtain second data,
wherein the memory control circuit unit is further configured to obtain a first threshold voltage distribution corresponding to a first bit value and a second threshold voltage distribution corresponding to a second bit value by analyzing the first data and the second data, wherein the first bit value and the second bit value are different,
wherein the memory control circuit unit is further configured to calculate first channel reliability information corresponding to the at least one first physical unit according to the first threshold voltage distribution and the second threshold voltage distribution,
wherein the memory control circuit unit is further configured to send a writing command sequence containing instructions to program third data received from the host system to the at least one first physical unit,
wherein the memory control circuit unit is further configured to decode the third data stored in the at least one first physical unit according to the first channel reliability information when the third data is read from the at least one first physical unit.

9. The memory storage device as claimed in claim 8, wherein the memory control circuit unit is further configured to input a random seed into a random number generator to generate the first data and store at least one of the random seed and the first data.

10. The memory storage device as claimed in claim 8, wherein the operations that the memory control circuit unit obtains the first threshold voltage distribution and the second threshold voltage distribution and calculates the first channel reliability information comprise:
grouping a threshold voltage of each memory cell of the at least one first physical unit stored with the first data into one of a plurality of voltage regions according to the second data;
counting a first total number of first memory cells belonging to the first threshold voltage distribution among the memory cells grouped to each of the voltage regions according to the first data;
counting a second total number of second memory cells belonging to the second threshold voltage distribution among the memory cells grouped to each of the voltage regions according to the first data; and
calculating the first channel reliability information according to the first total number and the second total number.

11. The memory storage device as claimed in claim 8, wherein the operation that the memory control circuit unit decodes the third data according to the first channel reliability information comprises:
inquiring a look-up table by using the first channel reliability information to obtain predetermined channel reliability information, wherein the predetermined channel reliability information is previously recorded in the look-up table; and
decoding the third data according to the predetermined channel reliability information.

12. The memory storage device as claimed in claim 8, wherein the memory control circuit unit is further configured to select one of a plurality of channel reliability information sets according to the first channel reliability information, wherein the channel reliability information sets are previously recorded in a look-up table,
wherein the memory control circuit unit is further configured to obtain second channel reliability information corresponding to at least one second physical unit from the selected channel reliability information set,
wherein the memory control circuit unit is further configured to store fourth data received from the host system to at least one second physical unit,
wherein the memory control circuit unit is further configured to decode the fourth data stored in the at least one second physical unit according to the second channel reliability information when the fourth data is read from the at least one second physical unit.

13. The memory storage device as claimed in claim 12, wherein the at least one first physical unit and the at least one second physical unit are located on a same word line or a same word line layer.

14. The memory storage device as claimed in claim 8, wherein the at least one physical unit comprises a data bit region and a redundant bit region,
wherein the first data is stored in at least one of the data bit region and the redundant bit region.

15. A memory control circuit unit comprising:
a host interface, coupled to a host system;
a memory interface, coupled to a rewritable non-volatile memory module comprising a plurality of physical units;
an error checking and correcting circuit; and
a memory management circuit, coupled to the host interface, the memory interface and the error checking and correcting circuit,
wherein the memory management circuit is configured to send a writing command sequence, wherein the writing command sequence contains instructions to program first data into at least one first physical unit among the physical units,
wherein the memory management circuit is further configured to send a reading command sequence, wherein the reading command sequence contains instructions to read the at least one first physical unit to obtain second data,
wherein the memory management circuit is further configured to obtain a first threshold voltage distribution corresponding to a first bit value and a second threshold voltage distribution corresponding to a second bit value by analyzing the first data and the second data, wherein the first bit value and the second bit value are different,
wherein the memory management circuit is further configured to calculate first channel reliability information corresponding to the at least one first physical unit according to the first threshold voltage distribution and the second threshold voltage distribution,
wherein the memory management circuit is further configured to send a writing command sequence containing instructions to program third data received from the host system to the at least one first physical unit,
wherein the error checking and correcting circuit is configured to decode the third data stored in the at least one first physical unit according to the first channel reliability information when the third data is read from the at least one first physical unit.

16. The memory control circuit unit as claimed in claim 15, wherein the memory management circuit is further configured to input a random seed into a random number generator to generate the first data and store at least one of the random seed and the first data.

17. The memory control circuit unit as claimed in claim 15, wherein the operations that the memory management circuit obtains the first threshold voltage distribution and the second threshold voltage distribution and calculates the first channel reliability information comprise:
grouping a threshold voltage of each memory cell of the at least one first physical unit stored with the first data into one of a plurality of voltage regions according to the second data;
counting a first total number of first memory cells belonging to the first threshold voltage distribution among the memory cells grouped to each of the voltage regions according to the first data;
counting a second total number of second memory cells belonging to the second threshold voltage distribution among the memory cells grouped to each of the voltage regions according to the first data; and
calculating the first channel reliability information according to the first total number and the second total number.

18. The memory control circuit unit as claimed in claim 15, wherein the memory management circuit is further configured to inquire a look-up table by using the first channel reliability information to obtain predetermined channel reliability information, wherein the predetermined channel reliability information is previously recorded in the look-up table,
wherein the error checking and correcting circuit is further configured to decode the third data according to the predetermined channel reliability information.

19. The memory control circuit unit as claimed in claim 15, wherein the memory management circuit is further configured to select one of a plurality of channel reliability information sets according to the first channel reliability information,
wherein the channel reliability information sets are previously recorded in a look-up table,
wherein the memory management circuit is further configured to obtain second channel reliability information corresponding to at least one second physical unit from the selected channel reliability information set,
wherein the memory management circuit is further configured to store fourth data received from the host system to at least one second physical unit,
wherein the error checking and correcting circuit is further configured to decode the fourth data stored in the at least one second physical unit according to the second channel reliability information when the fourth data is read from the at least one second physical unit.

20. The memory control circuit unit as claimed in claim 19, wherein the at least one first physical unit and the at least one second physical unit are located on a same word line or a same word line layer.

21. The memory control circuit unit as claimed in claim 15, wherein the at least one physical unit comprises a data bit region and a redundant bit region,
wherein the first data is stored in at least one of the data bit region and the redundant bit region.

* * * * *